US011315543B2

(12) United States Patent
Lashkari et al.

(10) Patent No.: US 11,315,543 B2
(45) Date of Patent: Apr. 26, 2022

(54) POLE-ZERO BLOCKING MATRIX FOR LOW-DELAY FAR-FIELD BEAMFORMING

(71) Applicant: Cirrus Logic International Semiconductor Ltd., Edinburgh (GB)

(72) Inventors: Khosrow Lashkari, Mesa, AZ (US); Narayan Kovvali, Mesa, AZ (US); Seth Suppappola, Mesa, AZ (US)

(73) Assignee: Cirrus Logic, Inc., Austin, TX (US)

( * ) Notice: Subject to any disclaimer, the term of this patent is extended or adjusted under 35 U.S.C. 154(b) by 147 days.

(21) Appl. No.: 16/773,259

(22) Filed: Jan. 27, 2020

(65) Prior Publication Data

US 2021/0233509 A1    Jul. 29, 2021

(51) Int. Cl.
| | | |
|---|---|---|
| *G10K 11/178* | (2006.01) | |
| *H04R 3/00* | (2006.01) | |
| *H04S 7/00* | (2006.01) | |

(52) U.S. Cl.
CPC ....... *G10K 11/17881* (2018.01); *H04R 3/005* (2013.01); *H04S 7/301* (2013.01); *G10K 2210/1082* (2013.01); *G10K 2210/3035* (2013.01)

(58) Field of Classification Search
CPC ..... G10K 11/17881; G10K 2210/1082; G10K 2210/3035; H04R 3/005; H04R 2430/25; H04S 7/301
USPC .......................................................... 381/92
See application file for complete search history.

(56) References Cited

U.S. PATENT DOCUMENTS

| | | |
|---|---|---|
| 6,674,795 B1 | 1/2004 | Liu et al. |
| 6,859,775 B2 | 2/2005 | Lashkari et al. |
| 8,204,252 B1 * | 6/2012 | Avendano ............. H04R 5/027 381/94.7 |
| 10,013,995 B1 | 7/2018 | Lashkari et al. |
| 2010/0246851 A1 * | 9/2010 | Buck ................. G10L 21/0208 381/94.1 |
| 2015/0265189 A1 | 9/2015 | Allen et al. |

OTHER PUBLICATIONS

Diene et al. ("Linearly Constrained Adaptive Filtering Algorithms Designed Using Control Liapunov Functions", The Federal University of Rio de Janeiro, CBA, 2006). (Year: 2006).*

* cited by examiner

*Primary Examiner* — Jason R Kurr
*Assistant Examiner* — Douglas J Suthers
(74) *Attorney, Agent, or Firm* — E. Alan Davis; James W. Huffman

(57) ABSTRACT

A system performs pole-zero or IIR modeling and estimation of an inter-microphone transfer function between first and second microphones that output respective first and second microphone signals. The system includes a first adaptive FIR filter to which the first microphone signal is provided, a delay element that delays the second microphone signal by a predetermined delay amount, and a second adaptive FIR filter to which the delayed second microphone signal is provided. A first coefficient of the second adaptive FIR filter is constrained to a fixed non-zero value. The filters are jointly adapted to minimize an error signal that is a difference of the two filters outputs. The delay is small: approximately the acoustic propagation delay between the two microphones and is not determined by the environmental reverberation characteristics. The error signal may serve as a noise reference in a noise canceller, for implementing far-field beamforming with low delay.

30 Claims, 6 Drawing Sheets

POLE-ZERO BLOCKING MATRIX FOR LOW-DELAY FAR-FIELD BEAMFORMING

BACKGROUND

Far-field audio processing is an important feature in voice-enabled devices, such as digital voice assistants used in smart-home applications. This feature is important because in home environments the far-field audio capture is often corrupted by background noise and room reverberation effects, and far-field audio processing steps, such as multi-microphone noise-reduction or beamforming, are needed for improving automatic speech recognition (ASR) performance as well as enhancing speech quality for voice communication.

Voice-controlled devices typically include multiple microphones that are used to acquire audio data or signals. These devices also include a digital signal processor (DSP) that performs spatial processing using the multiple microphone audio signals in order to reduce the amount of noise relative to the speech of a desired talker, e.g. whose voice commands may need to be recognized by an ASR engine. The spatial processing may be characterized as a beamformer, which is a spatially selective filter that treats the sound arriving at the device from different sources differently, e.g. to selectively preserve sound from the desired talker's location and attenuate sound from other (noise) locations. In many applications the talker and noise locations are a priori unknown and/or time-varying, and an adaptive beamformer is used to estimate spatial statistics from the microphone data and track changes.

A well-known adaptive beamforming framework is the generalized sidelobe canceller (GSC), described in J. Bitzer and K. U. Simmer, "Superdirective Microphone Arrays," in M. Brandstein and D. Ward, eds., *Microphone Arrays*, Springer, 2001, pp. 19-38. The GSC is popular due to its theoretical optimality and efficient adaptive implementation. The GSC is comprised of two main components: an adaptive blocking matrix (ABM) that generates 'noise reference' signals by blocking the signal of interest (speech from the desired talker) at the secondary microphones, and an adaptive noise canceller or sidelobe canceller (SLC) that generates the noise-reduced beamformer output by using the noise references provided by the blocking matrix to cancel noise from the primary microphone while preserving the desired talker's speech. The speech blocking matrix and noise canceller may be adapted in response to a change in the talker or noise location.

The classical GSC beamforming framework assumes a simple anechoic or free-field sound propagation model with no multipath reflections or reverberation and is therefore not optimum for processing far-field audio in real reverberant room environments. A GSC beamforming framework based on a more realistic sound propagation model is the transfer function GSC (TF-GSC) proposed in S. Gannot, D. Burshtein, and E. Weinstein, "Signal Enhancement Using Beamforming and Nonstationarity with Applications to Speech," *IEEE Transactions on Signal Processing*, vol. 49, no. 8, pp. 1614-1626, August 2001. The sound propagation model used in the TF-GSC incorporates the source-to-microphone room impulse response (RIR) or room transfer function (RTF) that captures the multipath effects of the direct arrival, multiple reflections, and room reverberation as the sound propagates from the talker to a microphone. In particular, the talker speech blocking matrix is designed based on the inter-microphone transfer function or TF ratio. The use of a more realistic sound propagation model allows the TF-GSC to achieve better speech enhancement performance in reverberant environments.

An important aspect of the GSC adaptive blocking matrix implementation is the need to model the inter-microphone transfer function. Current implementations (e.g. the TF-GSC described in Gannot et al.) use an all-zero representation or finite impulse response (FIR) filter to model and estimate the ABM inter-microphone transfer function. Unlike the source-to-microphone transfer function which can be modeled as a causal system, for stability the inter-microphone transfer function must be modeled as a noncausal system in the presence of reverberation. Unfortunately, significant delay, or latency, is introduced into a conventional far-field audio processing system to enable the FIR filter to adequately model the long and noncausal impulse response of the inter-microphone transfer function in reverberant conditions. This delay is undesirable in far-field audio processing applications, particularly for two-way voice communication, where low processing delay is required by international standards. Thus, for far-field beamforming there is a need to model the ABM inter-microphone transfer function in a way that does not introduce an unacceptable amount of delay.

SUMMARY

Far-field beamforming is an important feature in modern voice-enabled applications. Current beamformer implementations use an all-zero representation or finite impulse response (FIR) filter to model and estimate the long and noncausal impulse response of the inter-microphone transfer function in the talker speech adaptive blocking matrix (ABM) of the generalized sidelobe canceller (GSC) beamformer, introducing significant delay into the processing chain, which is undesirable. Embodiments of a system are described that use a pole-zero representation or infinite impulse response (IIR) filter to model and estimate the inter-microphone transfer function for the talker speech ABM of the GSC beamformer with substantially reduced delay as compared to conventional systems. In real reverberant room environments, the delay may be reduced from tens or hundreds of milliseconds to a few milliseconds, and for many microphone configurations to below one millisecond. The delay reduction may provide a significant benefit in far-field audio processing applications.

In one embodiment, the present disclosure provides a system for pole-zero or infinite impulse response (IIR) modeling and estimation of an adaptive blocking matrix (ABM) inter-microphone transfer function between first and second microphones that output respective first and second microphone signals. The system includes a first adaptive finite impulse response (FIR) filter to which the first microphone signal is provided as input, a delay element that delays the second microphone signal by a predetermined delay amount, and a second adaptive FIR filter to which the delayed second microphone signal is provided as input. A linear constraint is applied to the coefficients of the first and second adaptive FIR filters. The first and second adaptive FIR filters are jointly adapted to minimize an error signal that is a difference of outputs of the first and second adaptive FIR filters.

In another embodiment, the present disclosure provides a method for pole-zero or infinite impulse response (IIR) modeling and estimation of an adaptive blocking matrix (ABM) inter-microphone transfer function between first and second microphones that output respective first and second microphone signals. The method includes providing the first microphone signal as input to a first adaptive finite impulse response (FIR) filter, delaying the second microphone signal by a predetermined delay amount, providing the delayed second microphone signal as input to a second adaptive FIR filter, applying a linear constraint to the coefficients of the first and second adaptive FIR filters, and jointly adapting the first and second adaptive FIR filters to minimize an error signal that is a difference of outputs of the first and second adaptive FIR filters.

DETAILED DESCRIPTION

Figure 1:
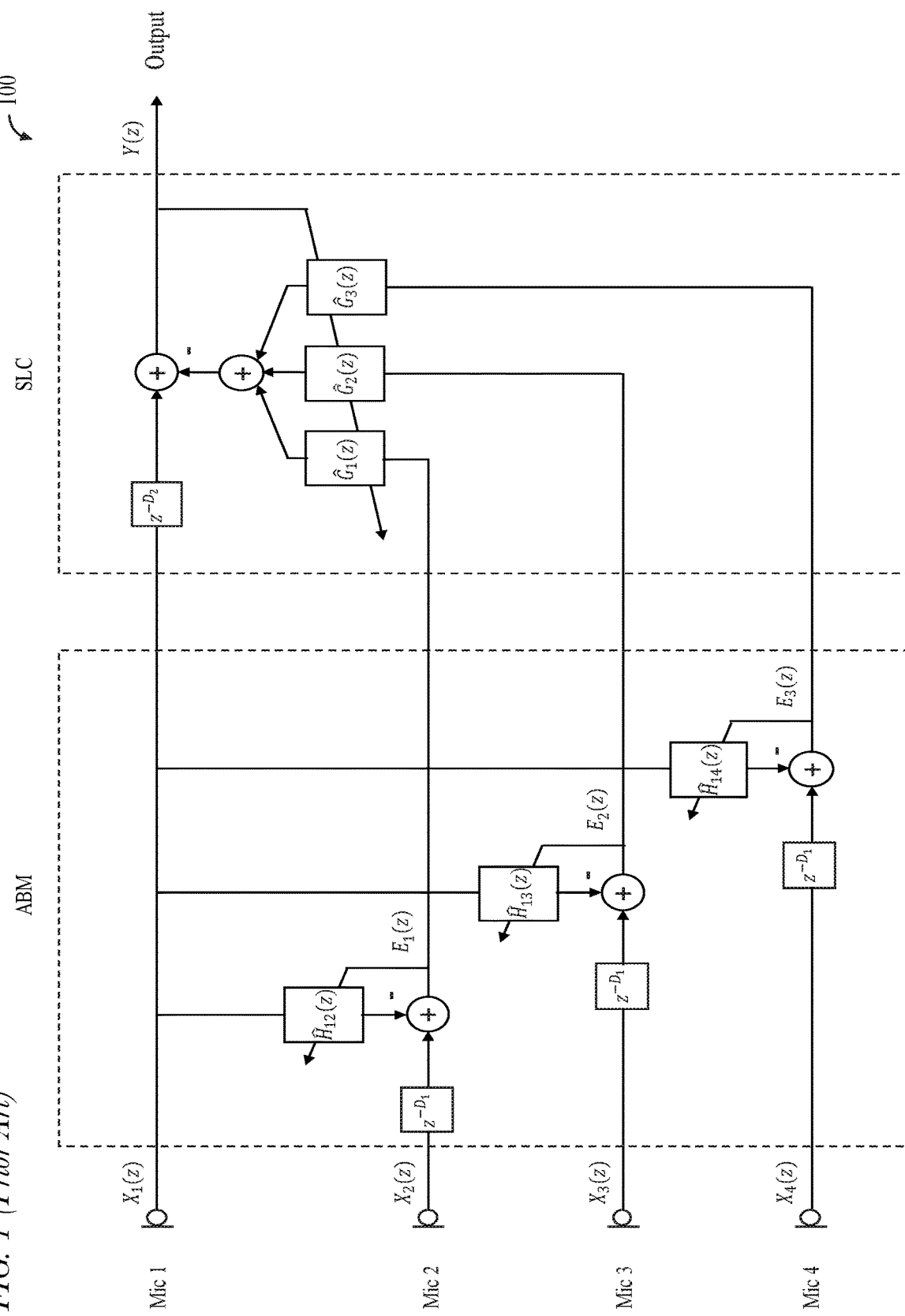
FIG. 1 is an example of a conventional GSC beamformer system that uses adaptive all-zero or FIR filter modeling and estimation in an adaptive blocking matrix (ABM).

FIG. 1 shows an example of a conventional GSC beamformer system 100. The system 100 includes four microphones, Mics 1-4, that provide signals with Z-transforms denoted by $X_1(z)$, $X_2(z)$, $X_3(z)$, and $X_4(z)$, which are the inputs to the system 100. Mic 1 is referred to as the primary microphone and Mics 2-4 as the secondary microphones. In a home environment, the microphones may receive voice commands or speech from a talker as well as noise from appliances, e.g. television, music system, etc. The beamformer 100 processes the microphone input signals to generate a beamformer output signal with Z-transform denoted by $Y(z)$ in which the talker's speech is preserved while the noise is reduced. The noise-reduced beamformer output signal $Y(z)$ may then be presented to an automatic speech recognition (ASR) system (not shown) for providing voice-enabled services. The GSC beamformer system 100 includes an adaptive blocking matrix (ABM) and an adaptive noise canceller or sidelobe canceller (SLC).

In the GSC beamformer system 100, the function of the ABM is to block the talker's speech in the secondary microphone signals $X_2(z)$, $X_3(z)$, and $X_4(z)$, and generate noise reference signals, with Z-transforms denoted by $E_1(z)$, $E_2(z)$, and $E_3(z)$, for the SLC. The ABM comprises three adaptive FIR filters, with Z-transforms denoted by $H_{12}(z)$, $H_{13}(z)$, and $H_{14}(z)$, that model and estimate the inter-microphone transfer functions $H_{12}(z)$, $H_{13}(z)$, and $H_{14}(z)$, respectively, for the talker. The filters $H_{12}(z)$, $H_{13}(z)$, and $H_{14}(z)$ receive the primary microphone signal $X_1(z)$ as input. A first delay element, denoted by $z^{-D_1}$, delays the secondary microphone signal $X_2(z)$ by an amount $D_1$. A first summing node subtracts the output of the filter $\hat{H}_{12}(z)$ from the delayed version of the secondary microphone signal $X_2(z)$. The output of the first summing node is an error signal $E_1(z)$, that is minimized by adapting the filter $H_{12}(z)$. A second delay element, denoted by $z^{-D_1}$, delays the secondary microphone signal $X_3(z)$ by an amount $D_1$. A second summing node subtracts the output of the filter $H_{13}(z)$ from the delayed version of the secondary microphone signal $X_3(z)$. The output of the second summing node is an error signal $E_2(z)$, that is minimized by adapting the filter $H_{13}(z)$. A third delay element, denoted by $z^{-D_1}$, delays the secondary microphone signal $X_4(z)$ by an amount $D_1$. A third summing node subtracts the output of the filter $H_{14}(z)$ from the delayed version of the secondary microphone signal $X_4(z)$. The output of the third summing node is an error signal $E_3(z)$, that is minimized by adapting the filter $\hat{H}_{14}(z)$. The error signals $E_1(z)$, $E_2(z)$, and $E_3(z)$ serve as the noise reference signals for the SLC. The adaptation of the ABM filters $\hat{H}_{12}(z)$, $H_{13}(z)$, and $H_{14}(z)$ is controlled by control logic (not shown), which adapts the ABM filters only when the talker's speech is determined to be present. By minimizing the error signals $E_1(z)$, $E_2(z)$, and $E_3(z)$ during talker speech activity, the ABM estimates the spatial statistics (inter-microphone transfer functions) of the talker and blocks the talker speech and provides the noise references, so that the SLC may cancel the noise but not the talker's speech at the primary microphone.

In the GSC beamformer system 100, the function of the SLC is to generate a noise-reduced beamformer output signal $Y(z)$ by using the noise reference signals $E_1(z)$, $E_2(z)$, and $E_3(z)$ provided by the ABM to cancel noise from the primary microphone signal $X_1(z)$ while preserving the talker's speech. The SLC is comprised of three adaptive FIR filters, with Z-transforms denoted by $\hat{G}_1(z)$, $\hat{G}_2(z)$, and $\hat{G}_3(z)$, which receive respective noise reference signals $E_1(z)$, $E_2(z)$, and $E_3(z)$ as input. A fourth summing node sums the outputs of the adaptive filters $\hat{G}_1(z)$, $\hat{G}_2(z)$, and $\hat{G}_3(z)$. A fourth delay element, denoted by $z^{-D_2}$, delays the primary microphone signal $X_1(z)$ by an amount $D_2$. A fifth summing node subtracts the output of the fourth summing node from the delayed version of the primary microphone signal $X_1(z)$ to generate the beamformer output signal $Y(z)$, that is minimized by jointly adapting the filters $\hat{G}_1(z)$, $\hat{G}_2(z)$, and $\hat{G}_3(z)$. The adaptation of the SLC filters is controlled by control logic (not shown), which adapts the SLC filters only when noise is determined to be present. By minimizing the output signal $Y(z)$ during noise activity, the SLC estimates the spatial statistics (inter-microphone correlations) of the noise and reduces the noise at the output of the beamformer.

In the GSC beamformer system 100, each of the ABM filters $\hat{H}_{1(k+1)}(z)$, k=1, 2, 3, models the corresponding inter-microphone transfer function $H_{1(k+1)}(z)$ between the primary microphone (Mic 1) and its respective secondary microphone (Mic 2, 3, or 4) for the talker. It is important that the inter-microphone transfer function is modeled accurately, so that the ABM can effectively block the talker's speech from the noise reference and the SLC only cancels the noise but none of the talker's speech at the primary microphone. In the conventional GSC beamformer system 100, each of the ABM filters $H_{1(k+1)}(z)$ is implemented using an all-zero representation or FIR filter. As explained in more detail below, for stability the inter-microphone transfer function must be modeled as a noncausal system. The FIR filter implementation models and estimates the noncausal impulse response of the inter-microphone transfer function in a stable manner by introducing a delay $D_1$ in the secondary microphone signal, as shown in FIG. 1. For a far-field talker in a real reverberant room environment, the inter-microphone impulse response can be long, and the amount of delay needed to ensure adequate modeling may be large (tens, or even hundreds, of milliseconds). Unfortunately, a large ABM delay $D_1$ proportionately increases the beamformer processing delay $D_2$. For example, in a conventional system the secondary microphone signals in the ABM may be delayed by 32 milliseconds, which adds 32 milliseconds of delay to the beamformer noise-reduced output. Advantageously, embodiments are described herein that use a pole-zero representation or IIR filter to model the ABM inter-microphone transfer function $H_{1(k+1)}(z)$ in a stable manner with low delay, substantially reducing the overall beamformer processing delay.

Figure 2A:
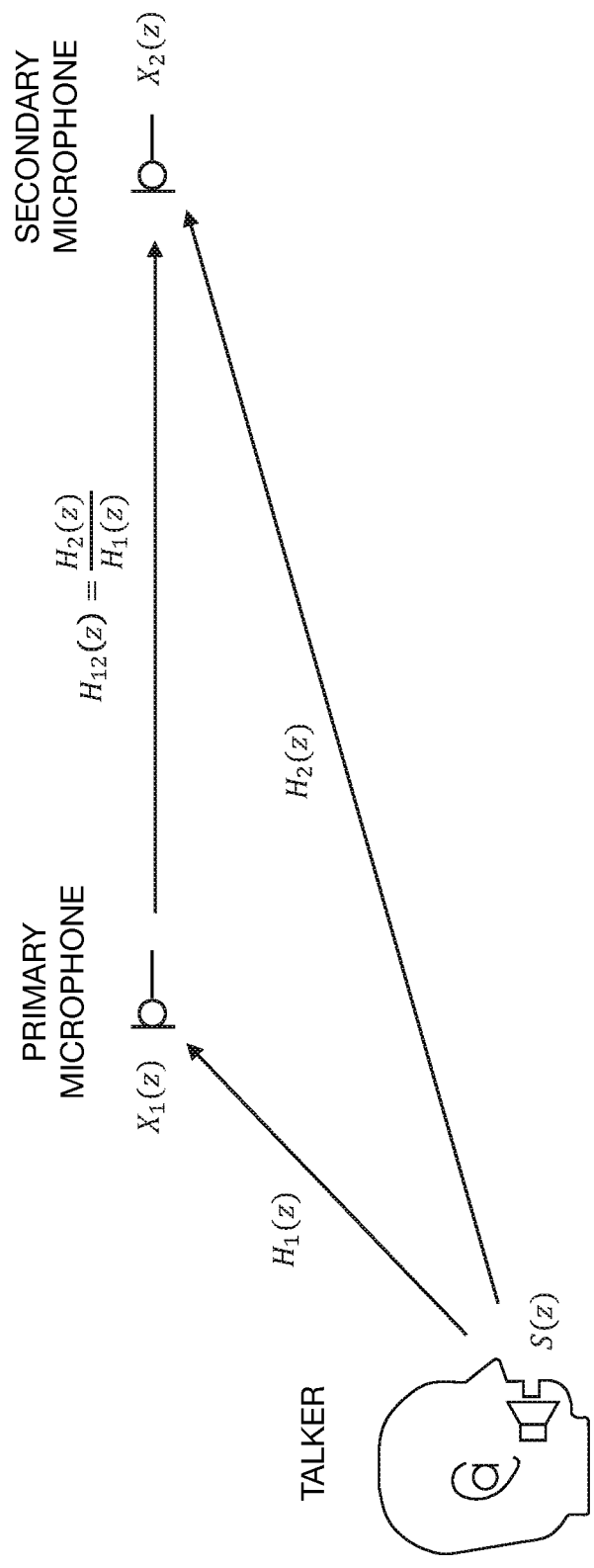
FIG. 2A is a diagram illustrating an example of the relationship between source-to-microphone transfer functions and the corresponding inter-microphone transfer function.
Figure 2B:
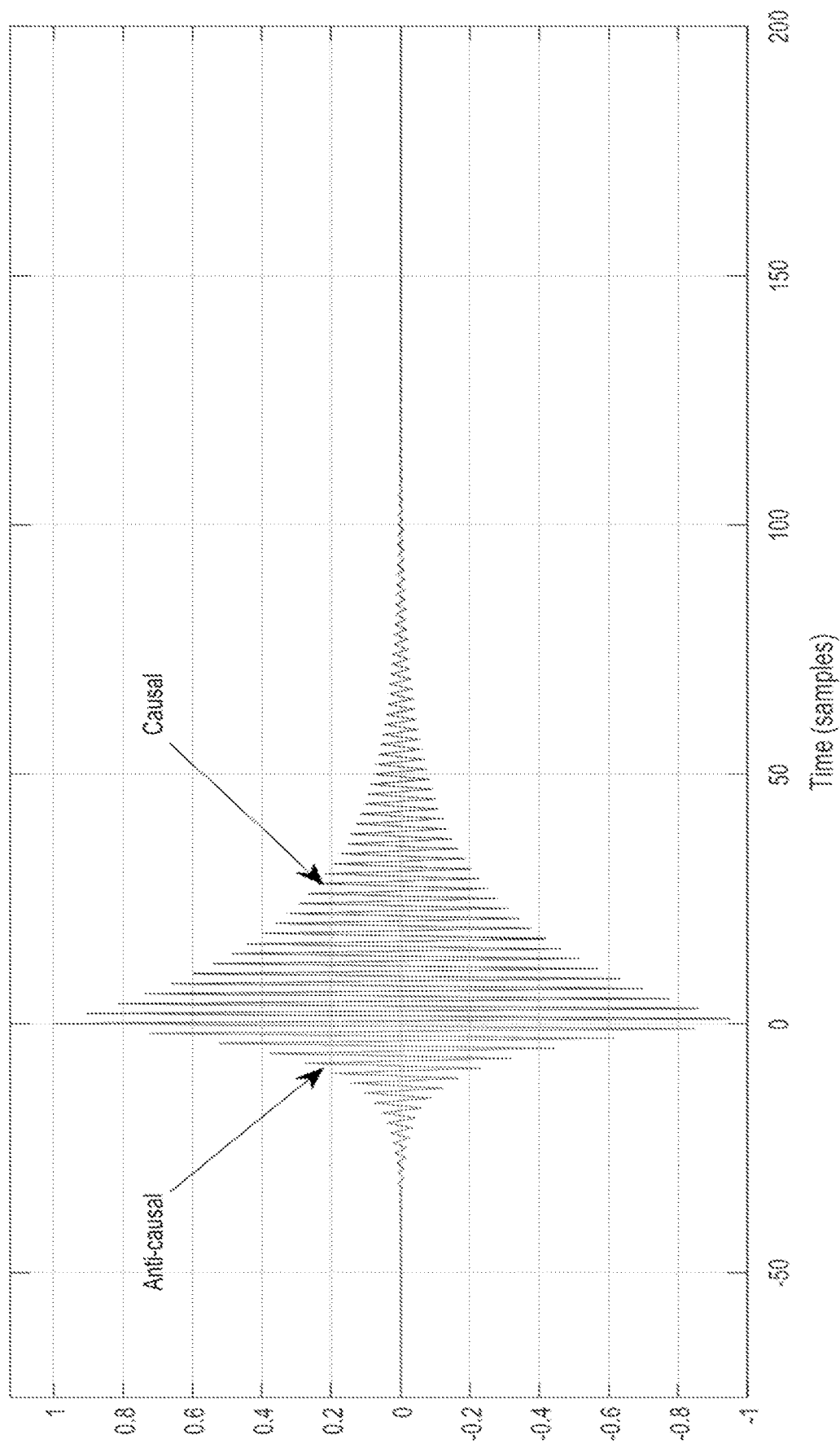
FIG. 2B is a graph illustrating an example synthetic inter-microphone impulse response.

FIGS. 2A and 2B include a diagram and a graph illustrating the relationship between two source-to-microphone transfer functions and the corresponding inter-microphone transfer function. FIG. 2A shows a first source-to-microphone transfer function, with Z-transform denoted by $H_1(z)$, that represents the acoustic channel between a talker and the primary microphone (e.g. Mic 1 of FIG. 1). FIG. 2A also shows a second source-to-microphone transfer function, with Z-transform denoted by $H_2(z)$, that represents the acoustic channel between the talker and a secondary microphone (e.g. Mic 2, 3, or 4 of FIG. 1). FIG. 2A also shows an inter-microphone transfer function, with Z-transform denoted by $H_{12}(z)$, which may be viewed as a system that receives the primary microphone signal as input and outputs the secondary microphone signal, as shown in FIG. 2A.

Although FIG. 2A shows an arrow directly from the talker to the primary microphone, in a reverberant environment, sound may travel from the talker over multiple paths before it reaches the primary microphone. The acoustic channel between the talker and the primary microphone, represented by the source-to-primary microphone transfer function $H_1(z)$, is a room transfer function (RTF) that captures the multipath effects of direct arrival, multiple reflections, and room reverberation as the sound propagates from the talker to the primary microphone. This acoustic channel may equivalently be represented by the source-to-primary microphone impulse response $h_1(n)$, a room impulse response (RIR) that includes various delays and scale factor coefficients corresponding to a superposition of the various sound propagation paths from the talker to the primary microphone. Similarly, although FIG. 2A shows an arrow directly from the talker to the secondary microphone, in a reverberant environment sound may travel from the talker over multiple paths before it reaches the secondary microphone. The acoustic channel between the talker and the secondary microphone, represented by the source-to-secondary microphone transfer function $H_2(z)$, is a RTF that captures the multipath effects of direct arrival, multiple reflections, and room reverberation as the sound propagates from the talker to the secondary microphone. This acoustic channel may equivalently be represented by the source-to-secondary microphone impulse response $h_2(n)$, a RIR that includes various delays and scale factor coefficients corresponding to a superposition of the various sound propagation paths from the talker to the secondary microphone.

In FIG. 2A, a talker's speech signal, with Z-transform denoted by $S(z)$, passes through the acoustic channel from the talker to the primary microphone, represented by the source-to-microphone transfer function $H_1(z)$, which generates the primary microphone signal $X_1(z)$. The talker's speech signal $S(z)$ also passes through the acoustic channel from the talker to the secondary microphone, represented by the source-to-microphone transfer function $H_2(z)$, which generates the secondary microphone signal $X_2(z)$. Thus, the primary microphone signal $X_1(z)$ and the secondary microphone signal $X_2(z)$ may be expressed by equations (1a) and (1b), taking into account only the talker's speech and ignoring noise in the microphone signals:

$$X_1(z)=S(z)H_1(z), \quad (1a)$$

$$X_2(z)=S(z)H_2(z). \quad (1b)$$

Since the inter-microphone transfer function $H_{12}(z)$ may be viewed as a system that receives the primary microphone signal as input and outputs the secondary microphone signal, the following mathematical relationship as shown in equation (2) results:

$$H_{12}(z) = \frac{X_2(z)}{X_1(z)} = \frac{H_2(z)}{H_1(z)}. \quad (2)$$

Thus, the inter-microphone transfer function $H_{12}(z)$ is the ratio of the two source-to-microphone transfer functions $H_2(z)$ and $H_1(z)$. Providing the primary microphone signal $X_1(z)$ as input to the inter-microphone transfer function $H_{12}(z)$ yields the secondary microphone signal $X_2(z)$, as expressed in equation (3), again taking into account only the talker's speech and ignoring noise in the microphone signals:

$$X_1(z)H_{12}(z) = X_1(z)\frac{H_2(z)}{H_1(z)} = S(z)H_1(z)\frac{H_2(z)}{H_1(z)} = S(z)H_2(z) = X_2(z). \quad (3)$$

Sound propagates at a finite speed and an utterance from the talker (and its reflections) can arrive at the microphones only after being spoken by the talker. Thus, the source-to-microphone transfer functions $H_1(z)$ and $H_2(z)$ are modeled by causal systems. However, as is well known (see S. T. Neely and J. B. Allen, "Invertibility of a room impulse response," *The Journal of the Acoustical Society of America*, vol. 66, no. 1, pp. 165-169, July 1979), the source-to-microphone transfer functions are, in general, non-minimum-phase. Thus, for stability, the inter-microphone transfer function $H_{12}(z)$, a system that is the ratio of the source-to-microphone transfer functions $H_2(z)$ and $H_1(z)$, and that receives the primary microphone signal as input and outputs the secondary microphone signal, must be modeled as a noncausal system. In other words, the inter-microphone impulse response $h_{12}(n)$ needed to predict the secondary microphone signal from the primary microphone signal is noncausal, consisting of a causal part (the right-hand side representing dependence on past primary microphone signal values) and an anti-causal part (the left-hand side representing dependence on future primary microphone signal values), as shown by the synthetic example in the graph of FIG. 2B. While conventional all-zero representation or FIR filter based models of the inter-microphone transfer function add significant delay (tens or hundreds of milliseconds in reverberant environments) to account for the noncausality, embodiments described herein that use a pole-zero representation or IIR filter based model of the inter-microphone transfer function address the noncausality with very low delay.

Sound loses energy as it propagates in an environment. In reverberant environments, it may take hundreds of milliseconds for the sound energy to decay to a negligible level. This energy loss is manifested in slow decay of RIR coefficients (long impulse responses). Typically, the source-to-microphone transfer functions $H_1(z)$ and $H_2(z)$ are modeled using all-zero representations or FIR filters with a sufficient number of filter coefficients. All-pole and pole-zero representations or IIR filters have also been applied for modeling the causal source-to-microphone transfer functions (see, for example, Y. Haneda, S. Makino, and Y. Kaneda, "Common Acoustical Pole and Zero Modeling of Room Transfer Functions," *IEEE Transactions on Speech and Audio Processing*, vol. 2, no. 2, pp. 320-328, April 1994). However, the inter-microphone transfer function $H_{12}(z)$ is inherently a rational or pole-zero transfer function because it is the ratio of the two source-to-microphone transfer functions $H_2(z)$ and $H_1(z)$. The zeros of the inter-microphone transfer function $H_{12}(z)$ are the roots of the numerator polynomial $H_2(z)$, and the poles are the roots of the denominator polynomial $H_1(z)$. This underlying pole-zero structure of the inter-microphone transfer function suggests that a pole-zero representation may be a more suitable model than the conventional all-zero representation. A pole-zero representation realizes an IIR filter that may need fewer number of numerator and denominator filter coefficients to achieve a certain modeling error as compared to an all-zero representation or FIR filter. The pole-zero representation or IIR filter based model of the noncausal inter-microphone transfer function described in the present disclosure may be especially advantageous in applications where high efficiency and low delay are critical.

In a conventional GSC beamformer system, such as the system 100 shown in FIG. 1, the ABM inter-microphone transfer function is modeled by providing the primary microphone signal as input to a FIR filter and significantly delaying the secondary microphone signal before summing with the FIR filter output. The large delay is necessary in order to ensure stable and adequate FIR modeling of the long and noncausal impulse response of the ABM inter-microphone transfer function in low direct-to-reverberation ratio (DRR) conditions (e.g. for a far-field talker in a real reverberant room). The significant delay introduced by the conventional approach may be unacceptable for many far-field audio processing applications, and particularly for two-way voice communications. However, advantageously, the embodiments described herein take into account the underlying pole-zero structure of the ABM inter-microphone transfer function to replace the conventional all-zero or FIR ABM framework with a pole-zero or IIR ABM framework. By using a pole-zero representation to model the noncausal ABM inter-microphone transfer function, the IIR ABM framework exploits the noncausal relationship inherent in the microphone signals and advantageously enables replacement of the conventionally large processing delay (e.g. tens or hundreds of milliseconds) with a much smaller delay (e.g. less than one millisecond for many microphone configurations). Furthermore, by realizing a more compact representation of the inter-microphone transfer function, the IIR ABM filter may be advantageous in terms of computational and storage efficiency.

Figure 3:
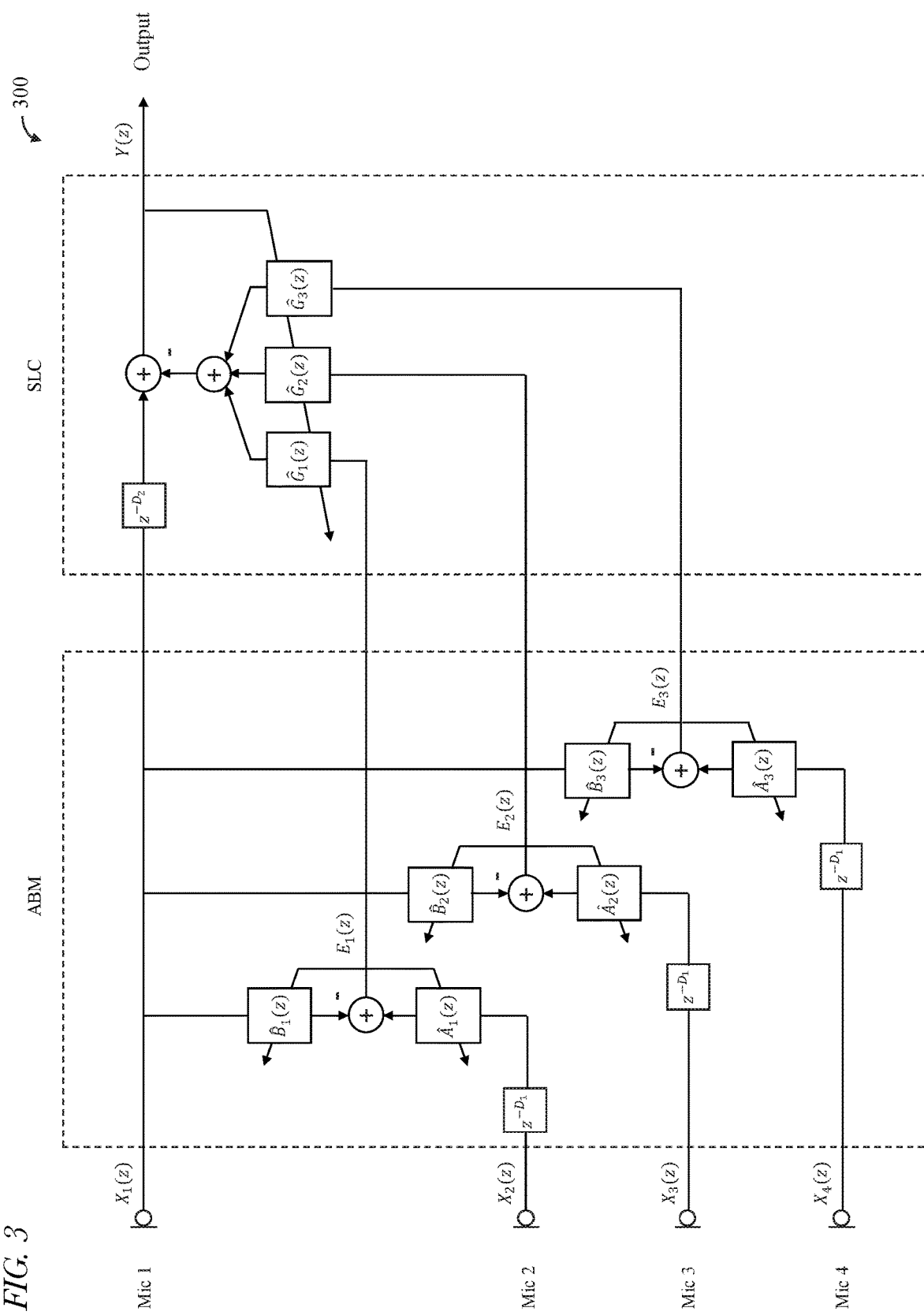
FIG. 3 is an example of a GSC beamformer system that uses adaptive pole-zero or IIR filter modeling and estimation in an ABM in accordance with embodiments of the present disclosure.

FIG. 3 shows an example of a GSC beamformer system 300 that uses pole-zero or IIR modeling and estimation in the ABM in accordance with embodiments of the present disclosure. The system 300 includes four microphones that provide signals, $X_1(z)$, $X_2(z)$, $X_3(z)$, and $X_4(z)$, which are the inputs to the system 300. The IIR ABM of the beamformer in FIG. 3 comprises three adaptive filter pairs, with Z-transforms denoted by $\hat{A}_1(z)$ and $\hat{B}_1(z)$, $\hat{A}_2(z)$ and $\hat{B}_2(z)$, and $\hat{A}_3(z)$ and $\hat{B}_3(z)$, denoted generically as $\hat{A}_k(z)$ and $\hat{B}_k(z)$, k=1, 2, 3. Each of the filters $\hat{A}_k(z)$ and $\hat{B}_k(z)$ is an adaptive FIR filter, and each pair $\hat{A}_k(z)$ and $\hat{B}_k(z)$ realizes an adaptive IIR filter. In the IIR ABM formulation, the adaptive FIR filters $\hat{B}_k(z)$ and $\hat{A}_k(z)$ model the numerator and denominator, respectively, of the inter-microphone transfer function $H_{1(k+1)}(z)$ for the talker, as described in more detail with respect to FIGS. 4 and 5. The primary microphone signal $X_1(z)$ is provided as input to each of the filters $\hat{B}_1(z)$, $\hat{B}_2(z)$, and $\hat{B}_3(z)$. A first delay element, denoted by $z^{-D_1}$, delays the secondary microphone signal $X_2(z)$ by an amount $D_1$, and the delayed version of the secondary microphone signal $X_2(z)$ is provided as input to the filter $\hat{A}_1(z)$. A second delay element, denoted by $z^{-D_1}$, delays the secondary microphone signal $X_3(z)$ by an amount $D_1$, and the delayed version of the secondary microphone signal $X_3(z)$ is provided as input to the filter $\hat{A}_2(z)$. A third delay element, denoted by $z^{-D_1}$, delays the secondary microphone signal $X_4(z)$ by an amount $D_1$, and the delayed version of the secondary microphone signal $X_4(z)$ is provided as input to the filter $\hat{A}_3(z)$. A first summing node subtracts the outputs of the filters $\hat{A}_1(z)$ and $\hat{B}_1(z)$ to generate the error signal $E_1(z)$, that is minimized by jointly adapting the filters $\hat{A}_1(z)$ and $\hat{B}_1(z)$; a second summing node subtracts the outputs of the filters $\hat{A}_2(z)$ and $\hat{B}_2(z)$ to generate the error signal $E_2(z)$, that is minimized by jointly adapting the filters $\hat{A}_2(z)$ and $\hat{B}_2(z)$; and a third summing node subtracts the outputs of the filters $\hat{A}_3(z)$ and $\hat{B}_3(z)$ to generate the error signal $E_3(z)$, that is minimized by jointly adapting the filters $\hat{A}_3(z)$ and $\hat{B}_3(z)$. The error signals $E_1(z)$, $E_2(z)$, and $E_3(z)$ serve as the noise reference signals for the SLC. The adaptation of the ABM filters $\hat{A}_k(z)$ and $\hat{B}_k(z)$, is controlled by control logic (not shown), which adapts the ABM filters only when the talker's speech is determined to be present. By minimizing the error signals $E_1(z)$, $E_2(z)$, and $E_3(z)$ during talker speech activity, the ABM estimates the necessary spatial statistics (inter-microphone transfer functions for the talker) and blocks the talker speech from the noise references, so that the SLC may cancel the noise but not the talker's speech at the primary microphone.

As described earlier, there exists an underlying pole-zero structure in the inter-microphone transfer function between the primary microphone Mic 1 and the secondary microphone Mic k+1, denoted by $H_{1(k+1)}(z)$, which is a ratio of the source-to-microphone transfer function $H_{k+1}(z)$ between the talker and the secondary microphone and the source-to-microphone transfer function $H_1(z)$ between the talker and the primary microphone. Each adaptive FIR filter pair $\hat{A}_k(z)$ and $\hat{B}_k(z)$ of the IIR ABM embodiment of FIG. 3 advantageously models and estimates the inter-microphone transfer function $H_{1(k+1)}(z)$ with low delay, i.e. the delay $D_1$ that needs to be introduced is small. The delay $D_1$ is small because each adaptive FIR filter pair models the inter-microphone transfer function in a pole-zero, or IIR, fashion as described in more detail below with respect to FIGS. 4 and 5. Critically, the delay $D_1$ is not determined by the environmental reverberation characteristics as is the case with the conventional FIR ABM system of FIG. 1. In one embodiment of the present disclosure, the delay $D_1$ of the IIR ABM modeling and estimation is approximated by the acoustic propagation delay of the talker's speech between the primary and secondary microphones. The delay $D_1$ need only be at least as much as the acoustic propagation delay of the talker's speech between the primary and secondary microphones, which may be a function of the distance between the microphones and their location on the device, and which may be known according to the design of the device that includes the system 300. As an example, assume an inter-microphone spacing of 6.5 cm, a sampling rate of 16 kHz, and a sound speed of 344 m/s. Then, ignoring any diffraction effects, the inter-microphone acoustic propagation delay is less than 0.2 milliseconds or 4 samples. That is, the IIR ABM delay need be no more than 0.2 milliseconds, in contrast to the tens or hundreds of milliseconds that may be needed in the conventional FIR ABM system. The substantially smaller IIR ABM delay $D_1$ proportionately decreases the beamformer processing delay $D_2$.

The conventional FIR ABM based beamformer system 100 shown in FIG. 1 models the inter-microphone transfer function $H_{1(k+1)}(z)$ as an FIR system by providing the primary microphone signal as input to an FIR filter $\hat{H}_{1(k+1)}(z)$ to generate an estimate of the (significantly) delayed secondary microphone signal. In contrast, the IIR ABM based beamformer system 300 shown in FIG. 3 models the inter-microphone transfer function $H_{1(k+1)}(z)$ as an IIR system by providing the primary and secondary microphone signals as inputs to a pair of FIR filters, $\hat{B}_k(z)$ and $\hat{A}_k(z)$, respectively, to generate an estimate of the (minimally) delayed secondary microphone signal. The substantially lower delay in the IIR ABM noise references directly results in a significant reduction in the overall beamformer processing delay.

Figure 4:
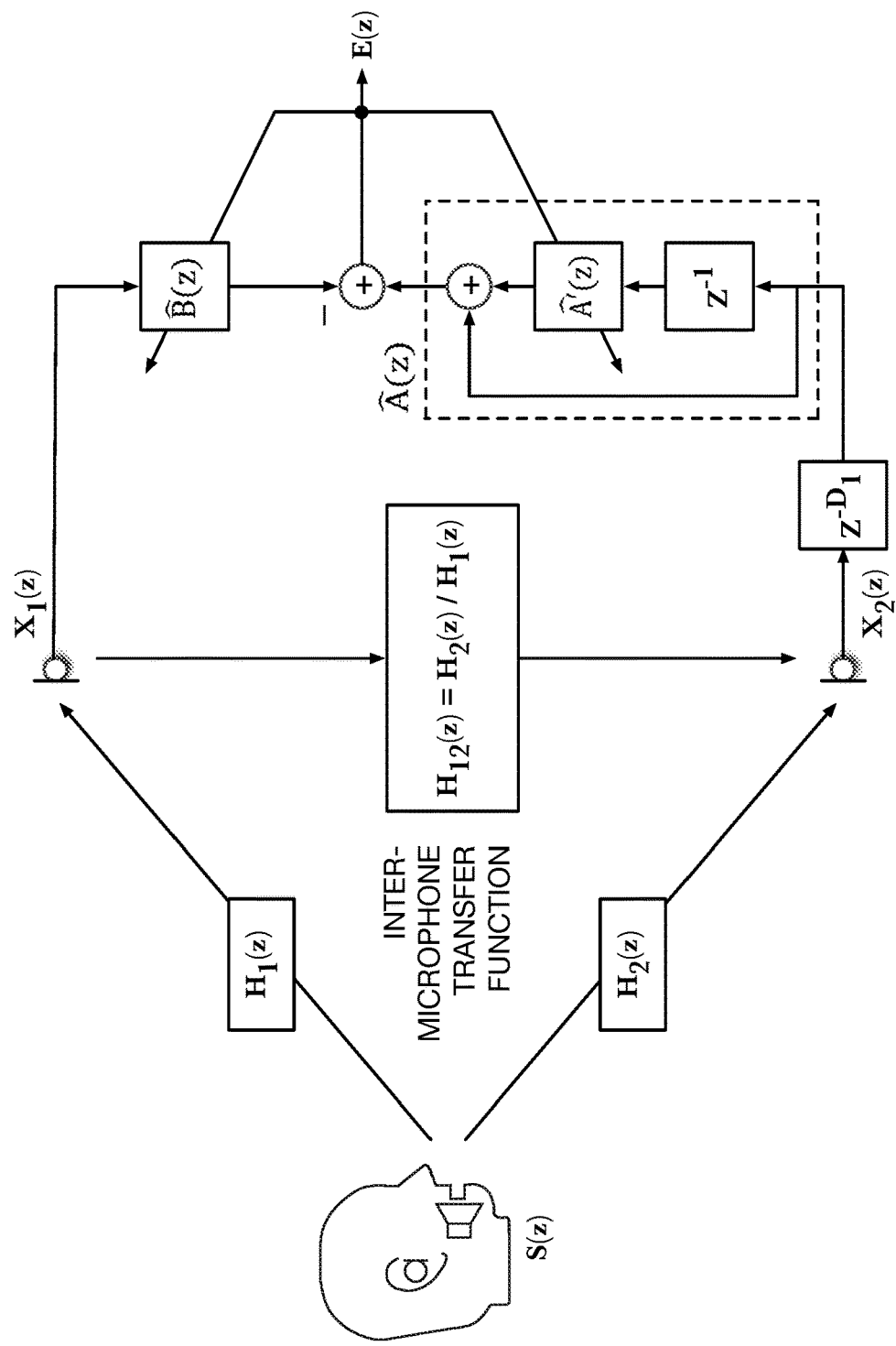
FIG. 4 is an example of a pole-zero or IIR ABM modeling and estimation system in accordance with embodiments of the present disclosure.

FIG. 4 shows an example of a pole-zero or IIR ABM modeling and estimation system 400 in accordance with embodiments of the present disclosure. Many elements of FIG. 4 are similar to elements of FIGS. 2A and 3, although only a single adaptive FIR filter pair is shown, with Z-transforms denoted by $\hat{A}(z)$ and $\hat{B}(z)$, which may correspond to any one of the generic filter pairs $\hat{A}_k(z)$ and $\hat{B}_k(z)$, k=1, 2, 3, of FIG. 3. In the embodiment of FIG. 4, the primary microphone signal $X_1(z)$ is provided as input to the filter $\hat{B}(z)$. A delay element, denoted by $z^{-D_1}$, delays the secondary microphone signal $X_2(z)$ by an amount $D_1$. The delayed secondary microphone signal is provided as input to the filter $\hat{A}(z)$. A first summing element subtracts the output of the filter $\hat{B}(z)$ from the output of the filter $\hat{A}(z)$ to generate an error signal $E(z)$, corresponding to a noise reference signal of FIG. 3, that is minimized by jointly adapting the filters $\hat{A}(z)$ and $(z)$. The error signal $E(z)$ that is minimized may be expressed as:

$$E(z) = X_2(z)z^{-D_1}\hat{A}(z) - X_1(z)\hat{B}(z). \tag{4}$$

In the IIR ABM, due to minimization of the error $E(z)$ defined in equation (4), the adaptive FIR filters $\hat{A}(z)$ and $\hat{B}(z)$ are configured such that, modulo the delay $D_1$, the ratio of $\hat{B}(z)$ and $\hat{A}(z)$ estimates the ratio of the two source-to-microphone transfer functions $H_2(z)$ and $H_1(z)$, i.e., the inter-microphone transfer function $H_{12}(z)$, as expressed in equation (5):

$$E(z) \approx 0 \Leftrightarrow \frac{\hat{B}(z)}{\hat{A}(z)} \approx \frac{X_2(z)}{X_1(z)} = \frac{H_2(z)}{H_1(z)} = H_{12}(z). \tag{5}$$

The adaptive FIR filters $(z)$ and $\hat{A}(z)$ model the numerator and denominator, respectively, of the inter-microphone transfer function $H_{12}(z)$.

The estimated pole-zero or IIR ABM filter is stable, because the inter-microphone transfer function $H_{12}(z)$ is modeled as a noncausal system. Even though the source-to-microphone transfer functions are in general non-minimum-phase, implying that some of the roots of the denominator polynomial $\hat{A}(z)$ may be inside the unit circle and some may be outside the unit circle, the roots that are outside the unit circle may be associated with the anti-causal part of the inter-microphone impulse response $h_{12}(n)$ and the roots that are inside the unit circle may be associated with the causal part of the inter-microphone impulse response $h_{12}(n)$ to produce a stable system.

Figure 5:
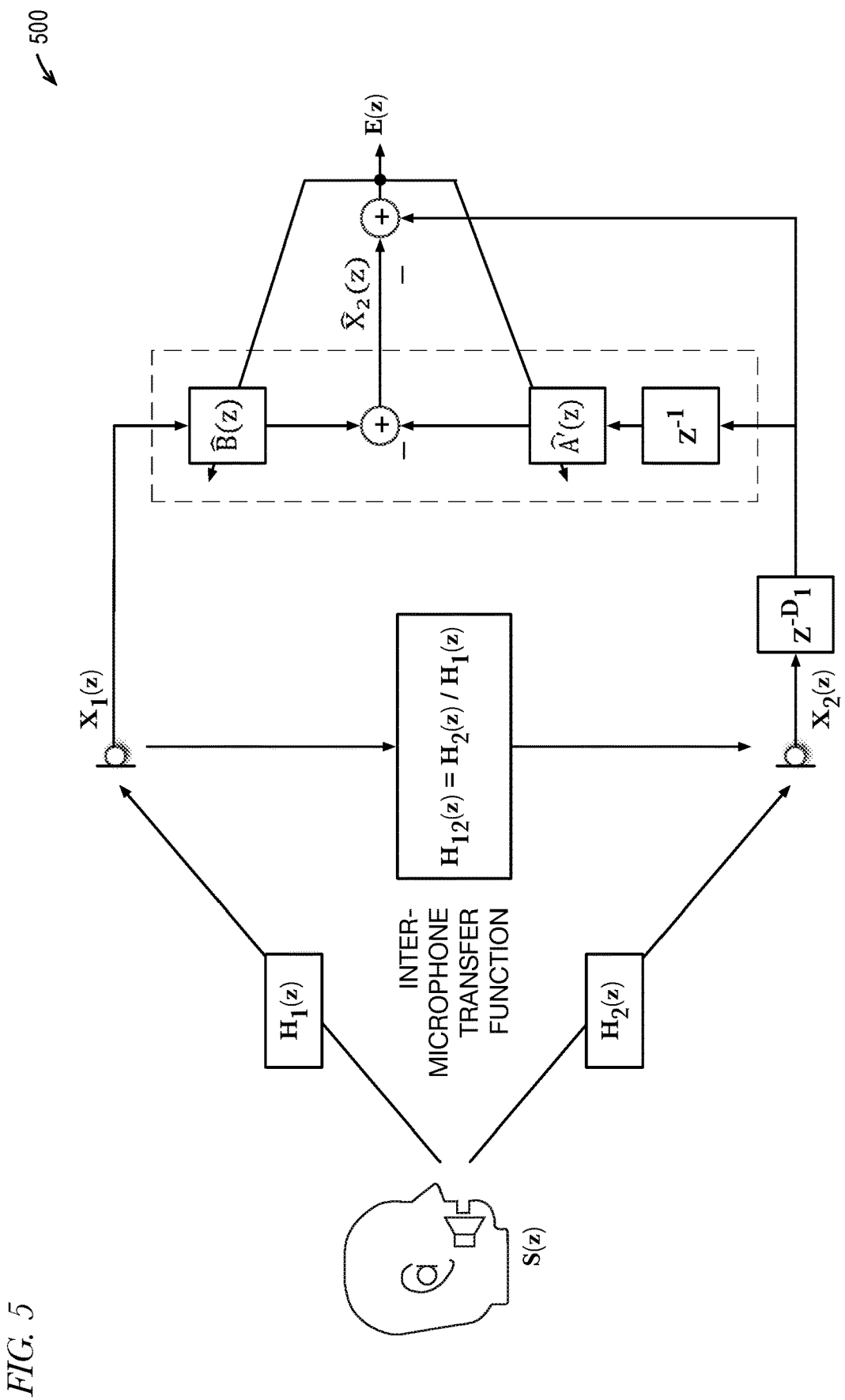
FIG. 5 is another example of a pole-zero or IIR ABM modeling and estimation system in accordance with embodiments of the present disclosure.

In order to eliminate sign and scale ambiguity in the estimated $\hat{A}(z)$ and $\hat{B}(z)$, in the embodiment of the present disclosure shown in FIGS. 4 and 5, the first coefficient of the adaptive FIR filter $\hat{A}(z)$ is constrained to a unity value. Specifically, the first coefficient of the adaptive FIR filter $\hat{A}(z)$ is not adapted but kept fixed at unity, whereas the other coefficients of the adaptive FIR filter $\hat{A}(z)$ and all coefficients of the adaptive FIR filter $\hat{B}(z)$ may be adapted to minimize the error signal $E(z)$. The constraint applied to the first coefficient of the adaptive FIR filter $\hat{A}(z)$, denoted by $a_D$, is given by equation (6):

$$a_0 = 1. \tag{6}$$

The constraint also avoids the trivial solution $\hat{A}(z) = \hat{B}(z) = 0$ during minimization of the error $E(z)$.

In the embodiment of the present disclosure shown in FIGS. 4 and 5, the first coefficient of the adaptive FIR filter $\hat{A}(z)$ is constrained to a unity value; however, other embodiments are contemplated in which the first coefficient of the adaptive FIR filter $\hat{A}(z)$ is constrained to a fixed non-zero value different from unity. Regardless of what fixed non-zero value the first coefficient of the adaptive FIR filter $\hat{A}(z)$ is constrained to, the estimated inter-microphone transfer function is the same since the adaptable coefficients of the adaptive FIR filter $\hat{A}(z)$ and the adaptive FIR filter $\hat{B}(z)$ may be scaled accordingly such that the ratio remains unaffected.

In yet another embodiment of the present disclosure, a general linear equality constraint on the coefficients of the adaptive FIR filters $\hat{A}(z)$ and $\hat{B}(z)$ may be used. For illustration, suppose the adaptive FIR filter $\hat{A}(z)$ has polynomial order M with coefficients denoted by $\{a_0, \ldots, a_m\}$ and the adaptive FIR filter $\hat{B}(z)$ has polynomial order M 1 with coefficients denoted by $\{b_0, \ldots, b_{m-1}\}$, then the linear constraint is of the form:

$$c_0 a_0 + c_1 a_1 + \ldots + c_M a_M + c_{M+i} b_0 + c_{M+2} b_1 + \ldots + c_{2M} b_{M-1} = d, \tag{7}$$

where $\{c_0, \ldots, c_{2M}\}$ and d are constants. The constraint on the first coefficient of the adaptive FIR filter $\hat{A}(z)$ to equal a fixed non-zero value is a special case of the linear constraint in which $c_0 = 1$, $c_1 = c_2 = \ldots = c_{2M} = 0$, with d being the fixed non-zero value, and the constraint on the first coefficient of the adaptive FIR filter $\hat{A}(z)$ to equal unity is a special case of the linear constraint in which $c_0 = 1$, $c_1 = c_2 = \ldots = c_{2M} = 0$, and $d = 1$.

As mentioned earlier, the delay $D_1$ that needs to be introduced in the pole-zero or IIR modeling and estimation of the ABM inter-microphone transfer function is small. In the embodiments of the present disclosure in which the first coefficient of the adaptive FIR filter $\hat{A}(z)$ is constrained to a unity value (shown in FIGS. 4 and 5) or a fixed non-zero value different from unity, the delay $D_1$ is approximated by the acoustic propagation delay of the talker's speech between the primary and secondary microphones. Selecting the delay $D_1$ to be at least as much as the acoustic propagation delay of the talker's speech between the primary and secondary microphones ensures that the fixed non-zero or unity value constraint applied to the first coefficient of the adaptive FIR filter $\hat{A}(z)$ may always be satisfied. In the embodiments of the present disclosure in which a general linear constraint is applied to the coefficients of the adaptive FIR filters $\hat{A}(z)$ and $\hat{B}(z)$, the delay $D_1$ that needs to be introduced (explicitly) may be zero. In this case, the delay in the IIR ABM modeling and estimation may be less than the acoustic propagation delay of the talker's speech between the primary and secondary microphones, and advantageously is modeled implicitly in the coefficients of the adaptive FIR filters $\hat{A}(z)$ and $\hat{B}(z)$.

In the embodiment of FIG. 4, the unity constraint applied to the first coefficient of the adaptive FIR filter $\hat{A}(z)$ is implemented as follows. The adaptive FIR filter $\hat{A}(z)$ is expressed as a summation of unity and a cascade of a 1-sample delay element $z^{-1}$ and an adaptive FIR filter $\hat{A}'(z)$, as shown in equation (8):

$$\hat{A}(z) = 1 + a_1 z^{-1} + a_2 z^{-2} + a_3 z^{-3} + a_4 z^{-4} + \ldots \quad (8)$$
$$= 1 + z^{-1}(a_1 + a_2 z^{-1} + a_3 z^{-2} + a_4 z^{-3} + \ldots)$$
$$= 1 + z^{-1} \hat{A}'(z).$$

The adaptive FIR filter $\hat{A}'(z)$ characterizes the adaptable coefficients of adaptive FIR filter $\hat{A}(z)$, as expressed in equation (8). A 1-sample delay element $z^{-1}$ delays the delayed secondary microphone signal $X_2(z)z^{-D_1}$ to generate a signal $X_2(z)z^{-(D_1+1)}$ that is provided as input to the adaptive FIR filter $\hat{A}'(z)$. A second summing element sums the output of the adaptive FIR filter $\hat{A}'(z)$ with the delayed secondary microphone signal $X_2(z)z^{-D_1}$ to generate the output of the adaptive FIR filter $\hat{A}(z)$, from which the output of the adaptive FIR filter $\hat{B}(z)$ is subtracted to generate the error signal $E(z)$. The adaptive FIR filter $\hat{A}'(z)$ is adapted jointly with the adaptive FIR filter $\hat{B}(z)$ to minimize the error signal $E(z)$, which may be expressed in equation (9):

$$E(z) = X_2(z) z^{-D_1} \hat{A}(z) - X_1(z) \hat{B}(z) \quad (9)$$
$$= X_2(z) z^{-D_1}\left(1 + z^{-1} \hat{A}'(z)\right) - X_1(z)\hat{B}(z)$$
$$= X_2(z) z^{-D_1} + X_2(z) z^{-(D_1+1)} \hat{A}'(z) - X_1(z)\hat{B}(z).$$

FIG. 5 shows another example of a pole-zero or IIR ABM modeling and estimation system 500 in accordance with embodiments of the present disclosure. Many elements of FIG. 5 are similar to elements of FIGS. 3 and 4, although the illustration of the pole-zero estimation system 500 is slightly different. As in the system 400 of FIG. 4, the adaptive FIR filters (z) and $\hat{A}(z)$ in the system 500 model the numerator and denominator, respectively, of the inter-microphone transfer function $H_{12}(z)$. In the embodiment of FIG. 5, the primary microphone signal $X_1(z)$ is provided as input to the adaptive FIR filter $\hat{\beta}(z)$. A 1-sample delay element $z^{-1}$ delays the delayed secondary microphone signal $X_2(z)z^{-D_1}$ to generate a signal $X_2(z)z^{-(D_1+1)}$ that is provided as input to the adaptive FIR filter $\hat{A}'(z)$. A first summing element subtracts the output of the adaptive FIR filter $\hat{A}'(z)$ from the output of the adaptive FIR filter $\hat{B}(z)$ to generate a signal $\hat{X}_2(z)$, which is an estimate of the delayed secondary microphone signal $X_2(z)z^{-D_1}$, and which may be expressed in equation (10):

$$\hat{X}_2(z) = X_1(z)\hat{B}(z) - X_2(z)z^{-(D_1+1)}\hat{A}'(z). \quad (10)$$

A second summing element subtracts signal $\hat{X}_2(z)$ from the delayed secondary microphone signal $X_2(z)z^{-D_1}$ to generate the error signal $E(z)$, which may be expressed in equation (11):

$$E(z) = X_2(z)z^{-D_1} - \hat{X}_2(z) \quad (11)$$

$$= X_2(z)z^{-D_1} - \left(X_1(z)\hat{B}(z) - X_2(z)z^{-(D_1+1)}\hat{A}'(z)\right)$$
$$= X_2(z)z^{-D_1}\left(1 + z^{-1}\hat{A}'(z)\right) - X_1(z)\hat{B}(z).$$

The adaptive FIR filter $\hat{A}'(z)$ is adapted jointly with adaptive FIR filter $\hat{B}(z)$ to minimize the error signal $E(z)$. Equation (11) shows that the IIR ABM embodiments of FIGS. 4 and 5 perform equivalent operations on the primary microphone signal $X_1(z)$ and the secondary microphone signal $X_2(z)$ to generate the same error signal $E(z)$. The formulation in equations (8)-(11) is a generalization of the equation-error method of adaptive IIR filtering (see J. J. Shynk, "Adaptive IIR Filtering," *IEEE ASSP Magazine*, vol. 6, no. 2, pp. 4-21, April 1989) to noncausal IIR system modeling and identification.

Efficient implementation of the adaptive beamformer is crucial for deployment in real-time audio processing systems. The adaptation of the filters described in the systems above may be carried out using the well-known least mean squares (LMS) adaptive filtering algorithm, which is popular due to its low computational complexity and good convergence properties (see B. Widrow and S. D. Stearns, *Adaptive Signal Processing*, Prentice Hall, 1985). The computational complexity may be further reduced using frequency-domain adaptive filtering techniques, as described in J. J. Shynk, "Frequency-Domain and Multirate Adaptive Filtering," *IEEE Signal Processing Magazine*, vol. 9, no. 1, pp. 14-37, January 1992.

An algorithm for efficient frequency-domain implementation of the pole-zero or IIR ABM in accordance with embodiments of the present disclosure will now be described. The algorithm is described with respect to FIG. 5, where the adaptive FIR filters $\hat{A}'(z)$ and $\hat{B}(z)$ are jointly adapted to minimize the error signal $E(z)$. Assume for ease of illustration and without loss of generality that the adaptive FIR filters $\hat{A}'(z)$ and $\hat{B}(z)$ have the same polynomial order $M-1$ and that, at time (frame index) $m$, their combined coefficient vector $\hat{w}^{(m)}$ is given by equation (12), and a combined microphone signal vector $u^{(m)}$ is given by equation (13), in which $x_1(n)$ and $x_2(n)$ are the time domain representations of the primary and secondary microphone signals, respectively:

$$\hat{w}^{(m)} = \left[-a_1^{(m)}, \ldots, -a_M^{(m)}, \underbrace{0\ldots0}_{M}, b_0^{(m)}, \ldots, b_{M-1}^{(m)}, \underbrace{0\ldots0}_{M}\right]^T, \quad (12)$$

$$u^{(m)} = [x_1(mM - 2M + 1), \ldots, x_1(mM), \quad (13)$$
$$x_2(mM - 2M - D_1), \ldots, x_2(mM - 1 - D_1)]^T.$$

Length-4M Fast Fourier Transforms (FFTs) are used to transform the combined coefficient and microphone signal vectors to frequency domain, as expressed in equations (14) and (15):

$$\hat{W}^{(m)} = \text{fft}(\hat{w}^{(m)}), \quad (14)$$

$$U^{(m)} = \text{fft}(u^{(m)}). \quad (15)$$

The time-domain estimate of the delayed secondary microphone signal vector at each time $m$ may be obtained efficiently as expressed by equations (16) and (17):

$$z = \text{ifft}(\hat{W}^{(m)} \cdot U^{(m)}) = \text{ifft}(\text{fft}(\hat{w}^{(m)}) \cdot \text{fft}(u^{(m)})), \quad (16)$$

$$\hat{x}_2^{(m)} = [\hat{x}_2(mM-M+1-D_1), \ldots, \hat{x}_2(mM-D_1)]^T = z(3M+1, \ldots, 4M). \quad (17)$$

The time-domain error signal vector at time m may be obtained as expressed by equation (18):

$$e^{(m)} = x_2^{(m)} - \hat{x}_2^{(m)} \tag{18}$$

where $$x_2^{(m)} = [x_2(mM-M+1-D_1), \ldots, x_2(mM-D_1)]^T \tag{19}$$

A length-4M FFT of the pre-zero-padded error signal vector is used to transform the error to frequency domain, as expressed by equation (20):

$$E^{(m)} = fft\left(\left[\underbrace{0, \ldots, 0}_{3M}, e^{(m)}\right]^T\right). \tag{20}$$

The power spectral density (PSD) of the combined microphone signal vector may be computed using exponential averaging according to equation (21):

$$P_{uu}^{(m)} = \gamma P_{uu}^{(m-1)} + (1-\gamma)|U^{(m)}|^2 \tag{21}$$

where $\gamma$ is a smoothing constant ($0 \leq \gamma < 1$).

To minimize the error signal adaptively, at each time m, the frequency-domain combined coefficient vector may be updated efficiently using a block normalized LMS update step according to equation (22):

$$\hat{W}^{(m+1)} = \hat{W}^{(m)} + \mu fft(\psi^{(m)}), \tag{22}$$

where $$\psi^{(m)} = \left[\varphi^{(m)}(1, \ldots, M), \underbrace{0, \ldots, 0}_{M}, \varphi^{(m)}(2M+1, \ldots, 3M), \underbrace{0, \ldots, 0}_{M}\right]^T, \tag{23}$$

$$\varphi^{(m)} = ifft(diag(P_{uu}^{(m)})^{-1} U^{(m)*} \cdot E^{(m)}), \tag{24}$$

and $\mu$ is a step size parameter selected to ensure good convergence and tracking performance. The power normalization in equation (24) jointly pre-whitens and decorrelates the microphone signals in order to achieve further improvement in speed of convergence.

Although in the present disclosure an embodiment of the pole-zero or IIR ABM implementation based on computationally efficient frequency-domain adaptive filtering is described, other embodiments are contemplated in which the pole-zero or IIR ABM implementation is based on the computationally efficient multidelay or partitioned-block frequency-domain adaptive filtering (PBFDAF) approach with low block processing delay, described in J.-S. Soo and K. K. Pang, "Multidelay Block Frequency Domain Adaptive Filter," *IEEE Transactions on Acoustics, Speech, and Signal Processing*, vol. 38, no. 2, pp. 373-376, February 1990.

Although in the present disclosure embodiments are described in which the pole-zero or IIR ABM is implemented in the frequency domain, other embodiments are contemplated in which the IIR ABM is implemented in the time domain. Preferably, the systems 300, 400, and 500 include a digital signal processor (DSP) programmed to perform the operations of the FIR filters as well as other operations associated with a beamformer.

Although in the present disclosure embodiments are described in which a pole-zero representation or IIR filter is used to model and estimate the talker speech adaptive blocking matrix (ABM) of the GSC beamformer, other embodiments are contemplated in which a pole-zero representation or IIR filter is used to model and estimate the adaptive noise canceller or sidelobe canceller (SLC) of the GSC beamformer.

It should be understood especially by those having ordinary skill in the art with the benefit of this disclosure that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. A system for pole-zero or infinite impulse response (IIR) modeling and estimation of an adaptive blocking matrix (ABM) inter-microphone transfer function between first and second microphones that output respective first and second microphone signals, comprising:

a first adaptive finite impulse response (FIR) filter to which the first microphone signal is provided as input;

a delay element that delays the second microphone signal by a predetermined delay amount; and a second adaptive FIR filter to which the delayed second microphone signal is provided as input;

wherein a linear constraint is applied to coefficients of the first and second adaptive FIR filters;

wherein the first and second adaptive FIR filters are jointly adapted to minimize an error signal that is a difference of outputs of the first and second adaptive FIR filters; and wherein the ABM inter-microphone transfer function is modeled and estimated by the system with low delay by using a pole-zero representation or IIR filter to exploit a noncausal relationship inherent in the first and second microphone signals.

2. The system of claim 1,
wherein, depending on the linear constraint applied to the coefficients of the first and second adaptive FIR filters, the predetermined delay amount may be zero.

3. The system of claim 1,
wherein the predetermined delay is substantially lower than a delay due to reverberation characteristics of sound received by the first and second microphones in reverberant conditions.

4. The system of claim 1,
wherein applying the linear constraint to coefficients of the first and second adaptive FIR filters comprises:
constraining a first coefficient of the second adaptive FIR filter to a fixed non-zero value.

5. The system of claim 4,
wherein to constrain the first coefficient of the second adaptive FIR filter to the fixed non-zero value, the system provides a 1-sample-delayed version of the delayed second microphone signal as input to a third adaptive FIR filter whose output is summed with the delayed second microphone signal gained by the fixed non-zero value to generate the output of the second adaptive FIR filter from which the first adaptive FIR filter output is subtracted to generate the error signal.

6. The system of claim 4,
wherein to constrain the first coefficient of the second adaptive FIR filter to the fixed non-zero value, the system provides a 1-sample-delayed version of the delayed second microphone signal as input to a third adaptive FIR filter whose output is subtracted from the first adaptive FIR filter output to generate an estimate of the delayed second microphone signal gained by the fixed non-zero value, which is subtracted from the delayed second microphone signal gained by the fixed non-zero value to generate the error signal.

7. The system of claim 4,
wherein the fixed non-zero value is unity.

8. The system of claim 1,
wherein the predetermined delay is approximately an acoustic propagation delay between the first and second microphones.

9. The system of claim 1,
wherein a ratio of transfer functions of the first and second adaptive FIR filters approximates the ABM inter-microphone transfer function.

10. The system of claim 1,
wherein the error signal is used as a noise reference in an adaptive noise canceller of a beamformer.

11. The system of claim 10,
wherein a pole-zero representation or IIR filter is used to model and estimate the adaptive noise canceller of the beamformer.

12. The system of claim 1, further comprising:
one or more additional microphones that output respective additional microphone signals;
wherein for each additional microphone of the one or more additional microphones, the system further comprises:
a first adaptive FIR filter to which the first microphone signal is provided as input;
a delay element that delays the respective additional microphone signal by a predetermined delay amount;
a second adaptive FIR filter to which the delayed respective additional microphone signal is provided as input;
wherein a linear constraint is applied to coefficients of the first and second adaptive FIR filters;
wherein the first and second adaptive FIR filters are jointly adapted to minimize an additional error signal that is a difference of outputs of the first and second adaptive FIR filters; and
wherein the additional error signals are included as noise references in an adaptive noise canceller of a beamformer.

13. A method for pole-zero or infinite impulse response (IIR) modeling and estimation of an adaptive blocking matrix (ABM) inter-microphone transfer function between first and second microphones that output respective first and second microphone signals, comprising:
providing the first microphone signal as input to a first adaptive finite impulse response (FIR) filter;
delaying the second microphone signal by a predetermined delay amount;
providing the delayed second microphone signal as input to a second adaptive FIR filter;
applying a linear constraint to coefficients of the first and second adaptive FIR filters; and
jointly adapting the first and second adaptive FIR filters to minimize an error signal that is a difference of outputs of the first and second adaptive FIR filters;
wherein the ABM inter-microphone transfer function is modeled and estimated by the method with low delay by using a pole-zero representation or IIR filter to exploit a noncausal relationship inherent in the first and second microphone signals.

14. The method of claim 13,
wherein, depending on the linear constraint applied to the coefficients of the first and second adaptive FIR filters, the predetermined delay amount may be zero.

15. The method of claim 13,
wherein the predetermined delay is substantially lower than a delay due to reverberation characteristics of sound received by the first and second microphones in reverberant conditions.

16. The method of claim 13,
wherein said applying the linear constraint to coefficients of the first and second adaptive FIR filters comprises:
constraining a first coefficient of the second adaptive FIR filter to a fixed non-zero value.

17. The method of claim 16,
wherein to constrain the first coefficient of the second adaptive FIR filter to the fixed non-zero value, the method provides a 1-sample-delayed version of the delayed second microphone signal as input to a third adaptive FIR filter whose output is summed with the delayed second microphone signal gained by the fixed non-zero value to generate the output of the second adaptive FIR filter from which the first adaptive FIR filter output is subtracted to generate the error signal.

18. The method of claim 16,
wherein to constrain the first coefficient of the second adaptive FIR filter to the fixed non-zero value, the method provides a 1-sample-delayed version of the delayed second microphone signal as input to a third adaptive FIR filter whose output is subtracted from the first adaptive FIR filter output to generate an estimate of the delayed second microphone signal gained by the fixed non-zero value, which is subtracted from the delayed second microphone signal gained by the fixed non-zero value to generate the error signal.

19. The method of claim 16, wherein the fixed non-zero value is unity.

20. The method of claim 13, wherein the predetermined delay is approximately an acoustic propagation delay between the first and second microphones.

21. The method of claim 13, wherein a ratio of transfer functions of the first and second adaptive FIR filters approximates the ABM inter-microphone transfer function.

22. The method of claim 13, further comprising:
using the error signal as a noise reference in an adaptive noise canceller of a beamformer.

23. The method of claim 22, wherein a pole-zero representation or IIR filter is used to model and estimate the adaptive noise canceller of the beamformer.

24. The method of claim 13, further comprising:
for each additional microphone of one or more additional microphones that output respective additional microphone signals, the method further comprises:
providing the first microphone signal to a first adaptive FIR filter;
delaying the respective additional microphone signal by a predetermined delay amount;
providing the delayed respective additional microphone signal as input to a second adaptive FIR filter;
applying a linear constraint to coefficients of the first and second adaptive FIR filters;
jointly adapting the first and second adaptive FIR filters to minimize an additional error signal that is a difference of outputs of the first and second adaptive FIR filters; and
including the additional error signals as noise references in an adaptive noise canceller of a beamformer.

25. A system for pole-zero or infinite impulse response (IIR) modeling and estimation of an adaptive blocking matrix (ABM) inter-microphone transfer function between first and second microphones that output respective first and second microphone signals, comprising:
a first adaptive finite impulse response (FIR) filter to which the first microphone signal is provided as input;
a delay element that delays the second microphone signal by a predetermined delay amount; and
a second adaptive FIR filter to which the delayed second microphone signal is provided as input;
wherein a linear constraint is applied to coefficients of the first and second adaptive FIR filters;
wherein the first and second adaptive FIR filters are jointly adapted to minimize an error signal that is a difference of outputs of the first and second adaptive FIR filters; and
wherein, depending on the linear constraint applied to the coefficients of the first and second adaptive FIR filters, the predetermined delay amount may be zero.

26. A system for pole-zero or infinite impulse response (IIR) modeling and estimation of an adaptive blocking matrix (ABM) inter-microphone transfer function between first and second microphones that output respective first and second microphone signals, comprising:
a first adaptive finite impulse response (FIR) filter to which the first microphone signal is provided as input;
a delay element that delays the second microphone signal by a predetermined delay amount; and
a second adaptive FIR filter to which the delayed second microphone signal is provided as input;
wherein a linear constraint is applied to coefficients of the first and second adaptive FIR filters;
wherein the first and second adaptive FIR filters are jointly adapted to minimize an error signal that is a difference of outputs of the first and second adaptive FIR filters; and
wherein applying the linear constraint to coefficients of the first and second adaptive FIR filters comprises:
constraining a first coefficient of the second adaptive FIR filter to a fixed non-zero value.

27. A system for pole-zero or infinite impulse response (IIR) modeling and estimation of an adaptive blocking matrix (ABM) inter-microphone transfer function between first and second microphones that output respective first and second microphone signals, comprising:
a first adaptive finite impulse response (FIR) filter to which the first microphone signal is provided as input;
a delay element that delays the second microphone signal by a predetermined delay amount;
a second adaptive FIR filter to which the delayed second microphone signal is provided as input;
wherein a linear constraint is applied to coefficients of the first and second adaptive FIR filters;
wherein the first and second adaptive FIR filters are jointly adapted to minimize an error signal that is a difference of outputs of the first and second adaptive FIR filters; and
one or more additional microphones that output respective additional microphone signals;
wherein for each additional microphone of the one or more additional microphones, the system further comprises:
a first adaptive FIR filter to which the first microphone signal is provided as input;
a delay element that delays the respective additional microphone signal by a predetermined delay amount; and
a second adaptive FIR filter to which the delayed respective additional microphone signal is provided as input;
wherein a linear constraint is applied to coefficients of the first and second adaptive FIR filters; and
wherein the first and second adaptive FIR filters are jointly adapted to minimize an additional error signal that is a difference of outputs of the first and second adaptive FIR filters; and
wherein the additional error signals are included as noise references in an adaptive noise canceller of a beamformer.

28. A method for pole-zero or infinite impulse response (IIR) modeling and estimation of an adaptive blocking matrix (ABM) inter-microphone transfer function between first and second microphones that output respective first and second microphone signals, comprising:
providing the first microphone signal as input to a first adaptive finite impulse response (FIR) filter;
delaying the second microphone signal by a predetermined delay amount;
providing the delayed second microphone signal as input to a second adaptive FIR filter;
applying a linear constraint to coefficients of the first and second adaptive FIR filters;

jointly adapting the first and second adaptive FIR filters to minimize an error signal that is a difference of outputs of the first and second adaptive FIR filters; and wherein, depending on the linear constraint applied to the coefficients of the first and second adaptive FIR filters, the predetermined delay amount may be zero.

29. A method for pole-zero or infinite impulse response (IIR) modeling and estimation of an adaptive blocking matrix (ABM) inter-microphone transfer function between first and second microphones that output respective first and second microphone signals, comprising:

providing the first microphone signal as input to a first adaptive finite impulse response (FIR) filter;

delaying the second microphone signal by a predetermined delay amount;

providing the delayed second microphone signal as input to a second adaptive FIR filter;

applying a linear constraint to coefficients of the first and second adaptive FIR filters;

jointly adapting the first and second adaptive FIR filters to minimize an error signal that is a difference of outputs of the first and second adaptive FIR filters; and wherein said applying the linear constraint to coefficients of the first and second adaptive FIR filters comprises:
constraining a first coefficient of the second adaptive FIR filter to a fixed non-zero value.

30. A method for pole-zero or infinite impulse response (IIR) modeling and estimation of an adaptive blocking matrix (ABM) inter-microphone transfer function between first and second microphones that output respective first and second microphone signals, comprising:

providing the first microphone signal as input to a first adaptive finite impulse response (FIR) filter;

delaying the second microphone signal by a predetermined delay amount;

providing the delayed second microphone signal as input to a second adaptive FIR filter;

applying a linear constraint to coefficients of the first and second adaptive FIR filters;

jointly adapting the first and second adaptive FIR filters to minimize an error signal that is a difference of outputs of the first and second adaptive FIR filters;

for each additional microphone of one or more additional microphones that output respective additional microphone signals:

providing the first microphone signal to a first adaptive FIR filter;

delaying the respective additional microphone signal by a predetermined delay amount;

providing the delayed respective additional microphone signal as input to a second adaptive FIR filter;

applying a linear constraint to coefficients of the first and second adaptive FIR filters; and jointly adapting the first and second adaptive FIR filters to minimize an additional error signal that is a difference of outputs of the first and second adaptive FIR filters; and including the additional error signals as noise references in an adaptive noise canceller of a beamformer.

* * * * *